United States Patent
Saie et al.

(10) Patent No.: US 8,409,467 B2
(45) Date of Patent: Apr. 2, 2013

(54) POLISHING LIQUID FOR SEMICONDUCTOR INTEGRATED CIRCUIT

(75) Inventors: Toshiyuki Saie, Haibara-gun (JP); Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 912 days.

(21) Appl. No.: 12/209,409

(22) Filed: Sep. 12, 2008

(65) Prior Publication Data

US 2009/0078908 A1    Mar. 26, 2009

(30) Foreign Application Priority Data

Sep. 25, 2007    (JP) ................. 2007-247958

(51) Int. Cl.
*C09K 13/00*    (2006.01)

(52) U.S. Cl. ............. 252/79.1; 252/79.2; 252/79.3; 252/79.4; 216/37; 216/67; 438/689; 438/690; 438/691; 438/692; 427/340

(58) Field of Classification Search ......... 427/340; 216/37, 67; 438/689–693; 252/79.1–79.4
See application file for complete search history.

(56) References Cited

U.S. PATENT DOCUMENTS

| | | | | |
|---|---|---|---|---|
| 6,568,997 B2 * | 5/2003 | Costas et al. | ............ | 451/41 |
| 7,547,335 B2 * | 6/2009 | Seki et al. | ............ | 51/307 |
| 2003/0041526 A1 * | 3/2003 | Fujii et al. | ............ | 51/307 |
| 2005/0031789 A1 * | 2/2005 | Liu et al. | ............ | 427/340 |
| 2006/0276041 A1 | 12/2006 | Uchikura et al. | | |
| 2008/0161217 A1 * | 7/2008 | Zhang et al. | ............ | 510/176 |

FOREIGN PATENT DOCUMENTS

| | | |
|---|---|---|
| CN | 1 881 539 A | 5/2006 |
| EP | 1 522 565 A2 | 4/2005 |
| JP | 2000-084832 A | 3/2000 |
| JP | 2003-017446 A | 1/2003 |
| JP | 2003-142435 A | 5/2003 |
| JP | 2005-101545 A | 4/2005 |
| JP | 2006-352096 A | 12/2006 |

OTHER PUBLICATIONS

Office Action dated Aug. 2, 2012 in Chinese Application No. 200810149126.X.
Office Action dated Apr. 24, 2012 on Japanese Application No. JP 2007-247958.
Office Action dated Jan. 8, 2013 in Japanese Application No. JP 2007-247958.

* cited by examiner

*Primary Examiner* — Lan Vinh
*Assistant Examiner* — Maki Angadi
(74) *Attorney, Agent, or Firm* — Sughrue Mion, PLLC

(57) ABSTRACT

A polishing liquid for polishing a barrier layer of a semiconductor integrated circuit, which liquid includes: a quaternary ammonium cation; a corrosion inhibiting agent; a polymer compound having a sulfo group at a terminal; inorganic particles; and an organic acid, the pH of the polishing liquid being in the range of 1 to 7.

10 Claims, No Drawings

POLISHING LIQUID FOR SEMICONDUCTOR INTEGRATED CIRCUIT

CROSS-REFERENCE TO RELATED APPLICATION

This application claims priority under 35 USC 119 from Japanese Patent Application No. 2007-247958, the disclosure of which is incorporated by reference herein.

BACKGROUND OF THE INVENTION

1. Field of the Invention

The present invention relates to a polishing liquid that is used in a process of manufacturing a semiconductor device.

2. Description of the Related Art

In recent years, in the development of semi-conductor devices such as semi-conductor integrated circuits (hereinafter, referred to as "LSI"), increased density and integration have been sought by reducing the thickness of wiring lines and creating multiple layers thereof in order to miniaturize and increase the speeds of such devices. Moreover, various types of technologies, such as chemical mechanical polishing (hereinafter, referred to as "CMP"), and the like, have been employed in order to achieve this objective. CMP is an essential technology for surface planarization of processed layers, such as interlayer insulation films, for plug formation, for formation of embedded metal wiring lines, and the like, and CMP performs smoothing of a substrate and eliminates excessive metallic thin films from wiring line formation, and eliminates excessive barrier layer on the surface of insulating films.

A conventional method of CMP is one in which a polishing pad is fixed to the surface of a circular polishing table (polishing platen), the surface of the polishing pad is impregnated with a polishing liquid, the surface of the substrate (wafer) is pressed onto the pad, and both the polishing platen and the wafer are rotated while a predetermined amount of pressure (polishing pressure) is applied from the backsides thereof, such that the surface of the wafer is thereby planarized via the mechanical abrasion produced therefrom.

When semi-conductor devices such as LSIs are produced, fine lines are formed in multiple wiring layers, and a barrier metal such as of Ta, TaN, Ti and TiN is pre-formed in order to prevent diffusion of the wiring material into interlayer insulation film(s), and in order to improve adhesion of the wiring line material, when forming the metal wiring lines, such as of copper, in each of these layers.

In order to form each wiring layer, in general, a CMP process on metallic film (hereinafter, referred to as "metallic film CMP) is first performed at a single stage or at multiple stages to remove excess wiring material that has been deposited by plating or the like, and thereafter, a CMP process is carried out to remove barrier metal material (barrier metal) that has been exposed on the surface of the metallic film (hereinafter, referred to as "barrier metal CMP"). However, metallic film CMP can cause over-polishing, referred to as dishing, and occurrence of erosion of the wiring lines portions.

In order to reduce such dishing, in such barrier metal CMP, which follows the metallic film CMP, a wiring layer should be formed in which level differences due to dishing, erosion, and the like are ultimately reduced by regulating the polishing rate of the metal wiring portion and the polishing rate of the barrier metal portion. Specifically, in barrier metal CMP, it is preferable that the polishing rates of the barrier metal and insulation layer are moderately high, since dishing due to over-polishing of the wiring portion and erosion resulting from dishing may occur when the polishing rates of the barrier metal and the interlayer insulation film are relatively low when compared with to the polishing rate of the metal wiring material. Not only does this have the advantage of improving the barrier metal CMP throughput, but there is a requirement to relatively increase the polishing rates of the barrier metal and the insulation layer for the above reasons, since dishing is often caused by metallic film CMP in practice.

A metal polishing liquid employed in CMP generally includes abrasive grains (for example, aluminum oxide or silica) and an oxidizing agent (for example, hydrogen peroxide or persulfuric acid). The basic polishing mechanism is thought to be that the metal surface is oxidized with the oxidizing agent, and then the oxide film formed thereby is removed with the abrasive grains.

However, when a polishing liquid including these sorts of solid abrasive grains is used in a CMP process, problems such as polishing damage (scratching), a phenomenon in which the entire polishing surface is over-polished (thinning), a phenomenon in which the polished metallic surface is dished (dishing), and a phenomenon in which plural metallic wiring surfaces are dished due to over-polishing of the insulator placed between the metallic wiring layers (erosion), and the like, may occur.

Moreover, there are cost-related problems, such as a conventionally employed cleaning process for eliminating residual polishing liquid from a semi-conductor surface after polishing with a polishing liquid containing solid abrasive grains can be complicated, and such as the requirement that solid abrasive grains must be precipitated when disposing of liquid after such cleaning (waste liquid).

The following investigations have been conducted with regard to a polishing liquid containing this type of solid abrasive grains.

For example, a CMP polishing agent and a polishing method that aim to achieve a high polishing rate, with virtually no occurrence of scratching is proposed (for example, Japanese Patent Application Laid-Open No. 2003-17446), a polishing composition and a polishing method for improving washability in CMP is proposed (for example, Japanese Patent Application Laid-Open No. 2003-142435), and a polishing composition that aims to prevent agglomeration of abrasive grains is proposed (for example, Japanese Patent Application Laid-Open No. 2000-84832).

However, even with a polishing liquid such as described above, a technique that can realize a high polishing rate when polishing the necessary layer and that is capable of suppressing scratching caused by agglomeration of solid abrasive grains, has not been obtained.

In recent years, in particular, as wiring has come to be yet further miniaturized, low dielectric constant materials having an even lower dielectric constant than interlayer insulating films such as TEOS that have usually been used, have come to be used as insulating film. This kind of insulating film is called a Low-k film, which is made of, for example, an organic polymer based material, an SiOC based material or an SiOF based material and is usually used by laminating it with an insulating film. However, this kind of insulating film is lower in strength than existing insulating films; accordingly, in a CMP process, problems such as excessive polishing and scratching are more pronounced.

SUMMARY OF THE INVENTION

The present invention has been made in view of the above described circumstances.

According to an aspect of the invention, there is provided a polishing liquid for polishing a barrier layer of a semiconductor integrated circuit. The polishing liquid includes a quaternary ammonium cation, a corrosion inhibiting agent, a polymer compound having a sulfo group at a terminal, inorganic particles and an organic acid. The pH of the polishing liquid is in the range of 1 to 7.

DETAILED DESCRIPTION OF THE INVENTION

Hereinafter, specific embodiments of the invention will be described.

A polishing liquid of the invention includes a quaternary ammonium cation, a corrosion inhibiting agent, a polymer compound having a sulfo group at a terminal, inorganic particles and an organic acid, has the pH in the range of 1 to 7 and. As needs arise, the polishing liquid may include an arbitrary component.

The respective components that the polishing liquid of the invention contains may be used singularly or in a combination of at least two kinds thereof.

The "polishing liquid" of the present invention includes not only the polishing liquid at the time of using in polishing (specifically, the polishing liquid that is diluted as requried), but also includes a concentrated liquid of the polishing liquid. A concentrated liquid or a concentrated polishing liquid refers to a polishing liquid in which the concentration of a solute is regulated to a higher level than that of the polishing liquid when used in polishing, and is used by diluting with water or an aqueous solution at the time of polishing. The dilution rate is typically 1 to 20 times in volume. The expressions "concentrate" and "concentrated liquid" in the present specification are used as the expressions that are conventionally used to stand for "condensate" or "condensed liquid", i.e., a more concentrated state than the state when employed, rather than the meanings of general terminology accompanying a physical concentration process such as evaporation, and the like.

Hereinafter, each constituent component of the polishing liquid of the present invention will be explained in greater detail.

(A) Quaternary Ammonium Cation

The polishing liquid of the invention includes a quaternary ammonium cation (hereinafter, in some cases, may be simply referred to as "specific cation").

The quaternary ammonium cation in the invention, as long as it has a structure that contains one or two quaternary nitrogen in a molecular structure, is not restricted to particular one. Among these, from the viewpoint of achieving a sufficient improvement in the polishing rate, cations represented by the following formula (1) or formula (2) described below are preferred.

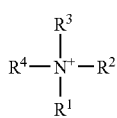

Formula (1)

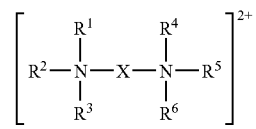

Formula (2)

In formula (1) and formula (2), $R^1$ to $R^6$ each independently represent an alkyl group having 1 to 20 carbon atoms, an alkenyl group, a cycloalkyl group, an aryl group or an aralkyl group, and two of $R^1$ to $R^6$ may be bonded with each other to form a ring structure.

Specific examples of the alkyl groups having 1 to 20 carbon atoms as $R^1$ to $R^6$ include a methyl group, an ethyl group, a propyl group, a butyl group, a pentyl group, a hexyl group, a heptyl group and an octyl group, and among these, a methyl group, an ethyl group, a propyl group and a butyl group are preferred.

The alkenyl group as $R^1$ to $R^6$ is preferably an alkenyl group having 2 to 10 carbon atoms and specific examples thereof include an ethenyl group and a propenyl group.

Specific examples of the cycloalkyl groups as the $R^1$ to $R^6$ include a cyclohexyl group and a cyclopentyl group, and among these, a cyclohexyl group is preferred.

Specific examples of the aryl groups as the $R^1$ to $R^6$ include a phenyl group and a naphtyl group, and among these, a phenyl group is preferred.

Specific examples of the aralkyl groups as the $R^1$ to $R^6$ include a benzyl group, and among the aralkyl groups, a benzyl group is preferred.

Each of the groups represented by the $R^1$ to $R^6$ may further have a substituent group. Examples of substituent groups that may be introduced include a hydroxyl group, an amino group, a carboxyl group, a heterocyclic group, a pyridinium group, an aminoalkyl group, a phosphate group, an imino group, a thiol group, a sulfo group and a nitro group.

In formula (2), X represents an alkylene group having 1 to 10 carbon atoms, an alkenylene group, a cycloalkylene group, an arylene group or a group obtained by combining at least two of these groups.

Moreover, in addition to the organic linking group as described above, the linking group represented by X may also include —S—, —S(=O)$_2$—, —O— or —C(=O)— in the chain thereof.

Specific examples of the alkylene groups having 1 to 10 carbon atoms include a methylene group, an ethylene group, a propylene group, a butylene group, a pentylene group, a hexylene group, a heptylene group and an octylene group, and, among these, an ethylene group and a pentylene group are preferred.

Specific examples of the alkenylene groups include an ethenylene group and a propenylene group, and among these, a propenylene group are preferred.

Specific examples of the cycloalkylene groups include a cyclohexylene group and a cyclopentylene group, and among these, a cyclohexylene group is preferred.

Specific examples of the arylene groups include a phenylene group and a naphtylene group, and among these, a phenylene group is preferred.

Each of the respective linking groups as described above may further have a substituent group. Examples of substituent groups that may be introduced include a hydroxyl group, an amino group, a sulfonyl group, a carboxyl group, a heterocyclic group, a pyridinium group, an aminoalkyl group, a phosphate group, an imino group, a thiol group, a sulfo group and a nitro group.

Hereinafter, specific examples [exemplified compounds (A-1) to (A-46) of the (A) quaternary ammonium cations (specific cations) in the invention will be shown without restricting thereto.
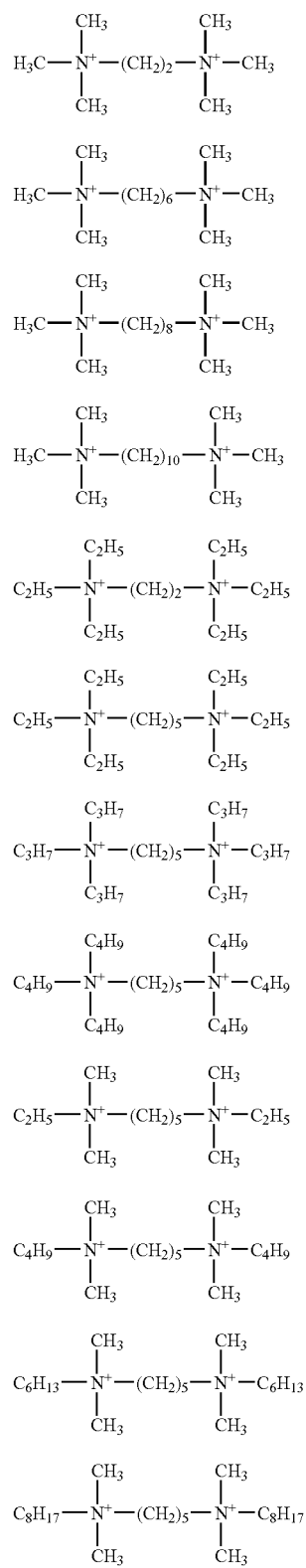

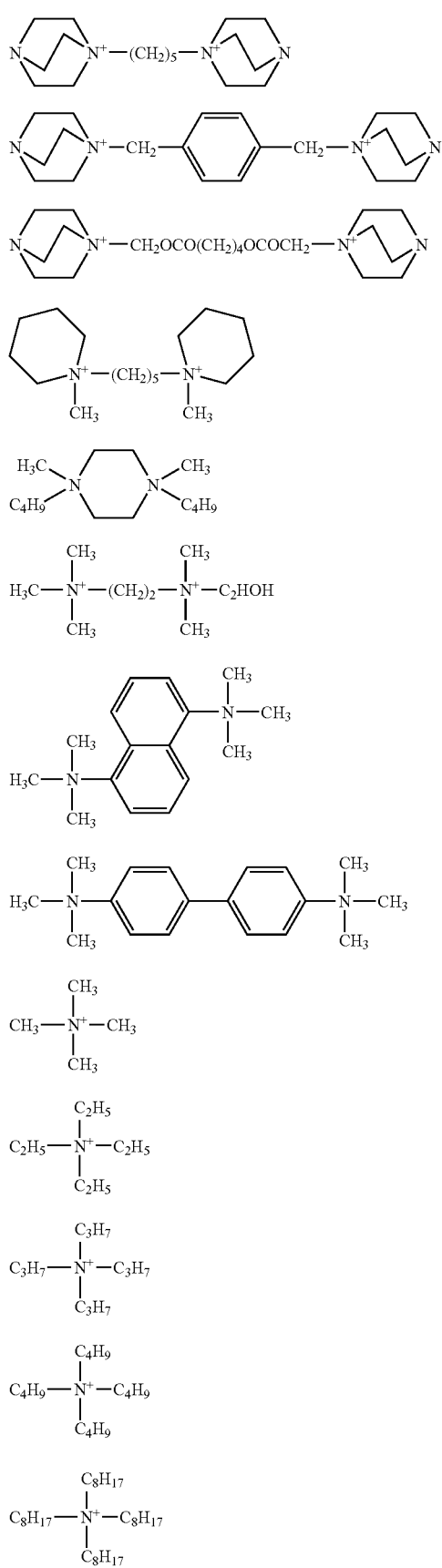
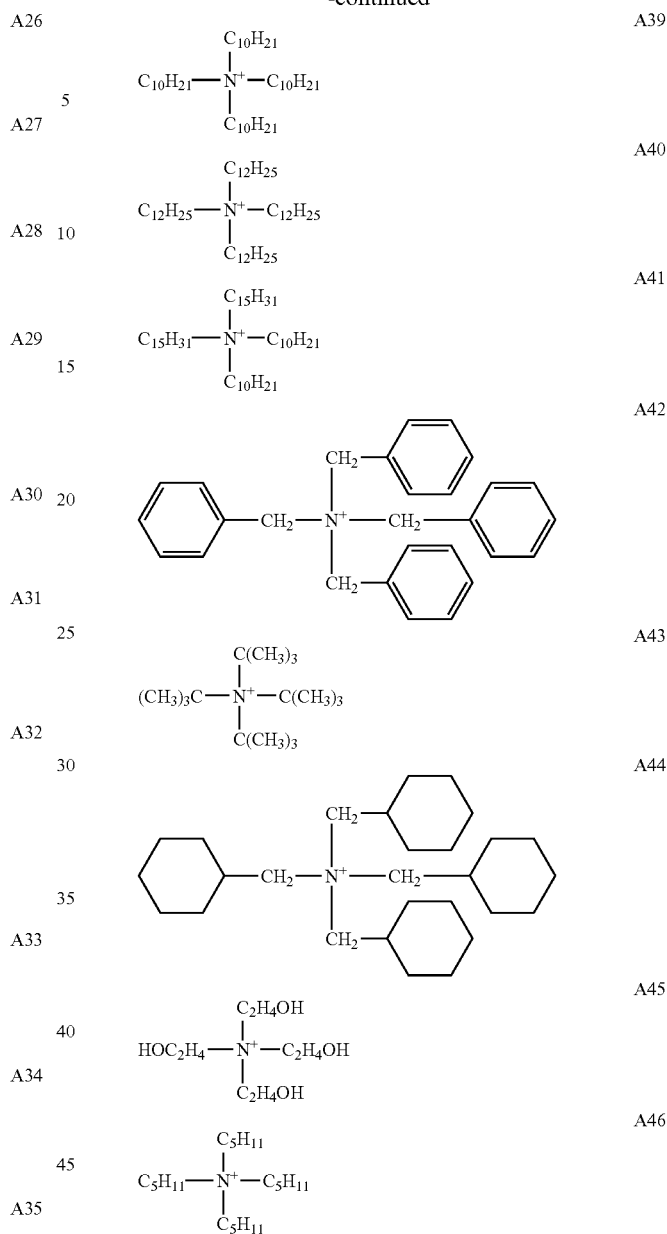

Considering the dispersion stability in the polishing liquid, among the abovementioned examples of the quaternary ammonium cation (specific cation), A8, A10, A11, A12, A36, A37 and A46 are preferable.

The (A) quaternary ammonium cation (specific cation) of the present invention may be synthesized, for example, by a substitution reaction, in which the ammonia or various types of amines, and the like, works as a nucleophilic agent. The quaternary ammonium cation may also be available as a commercial reagent.

The addition amount of the (A) quaternary ammonium cation (specific cation) with respect to the polishing liquid when used in polishing (specifically, if the polishing liquid is diluted by water or an aqueous solution, "the polishing liquid when used in polishing" refers to the polishing liquid after dilution. The same applies hereinafter) is preferably 0.0001 mass % to 1 mass %, and more preferably 0.001 mass % to 0.3 mass %. Specifically, the amount of the quaternary ammonium cation (specific cation) is preferably 0.0001 mass % or more from the perspective of sufficiently improving the polishing rate, and is preferably 0.3 mass % or less from the perspective of achieving sufficient stability of the slurry.

(B) Corrosion Inhibiting Agent:

The polishing liquid of the present invention includes a corrosion inhibiting agent that inhibits corrosion of the metallic surface by adsorbing to the surface to be polished and forming a film thereon. The corrosion inhibiting agent of the present invention preferably contains a heteroaromatic ring compound containing at least three nitrogen atoms in the molecule and having a condensed ring structure. Here, the "at least three nitrogen atoms" are preferably atoms constituting the condensed ring, and the heteroaromatic compound is preferably benzotriazole or derivatives thereof obtained by incorporating a substituent group of various kinds into the benzotriazole.

Examples of the corrosion inhibiting agents that may be used in the invention include benzotriazole, 1,2,3-benzotriazole, 5,4-dimethyl-1,2,3-benzotriazole, 1-(1,2-dicarboxyethyl)benzotriazole, 1-[N,N-bis(hydroxyethyl)aminomethyl]benzotiazole, 1-(hydroxymethyl)benzotriazole, tolyltriazole, 1-(1,2-dicarboxyethyl)tolyltriazole, 1-[N,N-bis(hydroxyethyl)aminomethyl]tolyltiazole, 1-(2,3-dihydroxypropyl)benzotriazole, and 1-(2,3-dihydroxypropyl)tolyltriazole. Among these, 1,2,3-benzotriazole, 5,4-dimethyl-1,2,3-benzotriazole, tolyltriazole, 1-(1,2-dicarboxyethyl)benzotriazole, 1-(1,2-dicarboxyethyl)tolyltiazole, 1-[N,N-bis(hydroxyethyl)aminomethyl]benzotriazole, 1-[N,N-bis(hydroxyethyl)aminomethyl]tolyltriazole, 1-(2,3-dihydroxypropyl)benzotriazole, 1-(2,3-dihydroxypropyl)tolyltriazole and 1-(hydroxymethyl)benzotriazole are preferred.

An addition amount of the (B) corrosion inhibiting agent with respect to an amount of the polishing liquid when used in polishing is preferably 0.01% by mass to 0.2% by mass, and more preferably 0.05% by mass to 0.2% by mass. That is, an addition amount of the corrosion inhibiting agent is preferably 0.01% by mass or more to inhibit the dishing from expanding and 0.2% by mass or less to secure the storage stability.

(C) Polymer Compound Having a Sulfo Group at a Terminal

The polishing liquid of the invention includes a polymer compound having a sulfo group at a terminal thereof.

In the polishing liquid of the invention, it is possible to improve the polishing rate and to control a polishing rate of an insulating layer by controlling a kind and/or an amount of the polymer compound having a sulfo group at a terminal.

Examples of structures of the polymer compounds having a sulfo group at a terminal include polyoxyethylene lauryl ether sulfate, polyoxyethylene phenyl ether sulfate, polyoxyethylene tridecylphenyl ether sulfate, polyoxypropylene lauryl ether sulfate, polyoxyethylene capryl ether sulfate, polyoxyethylene caprylphenyl ether sulfate, polyoxyethylene pentadecylphenyl ether sulfate and butylnaphthalene sulfonate. Among these, high polymers having a benzene ring are preferred.

Examples of the polymer compounds having a benzene ring include polyoxyethylene phenyl ether sulfate, polyoxyethylene tridecylphenyl ether sulfate, polyoxyethylene caprylphenyl ether sulfate, polyoxyethylene pentadecylphenyl ether sulfate and butyl naphthalene sulfonate.

The polymer compound having a sulfo group at a terminal may be a compound in which the sulfo group may have a salt structure such as a sodium salt, a potassium salt or an ammonium salt.

A weight average molecular weight of the polymer compound having a sulfo group at a terminal is preferably 500 to 5000, more preferably 600 to 4000 and particularly preferably 600 to 3000. That is, a weight average molecular weight of the polymer compound having a sulfo group at a terminal is, from the viewpoint of the SiOC polishing performance, preferably 500 or more and, from the viewpoint of the scratch prevention performance (scratch performance) after the polishing, preferably 3000 or less.

Hereinafter, specific examples [exemplified compounds (P-1) to (P-21)] of the (C) polymer compounds having a sulfo group at a terminal in the invention will be shown. However the invention is not restricting thereto. In the specific examples, n and m each independently represent an integer of 2 to 10, x and y each independently represent an integer, and x+y is 2 to 10. R represents an alkyl group having 1 to 12 carbon atoms.

P-1
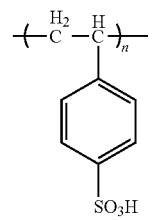

P-2
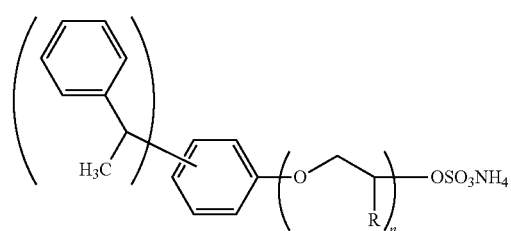

P-3
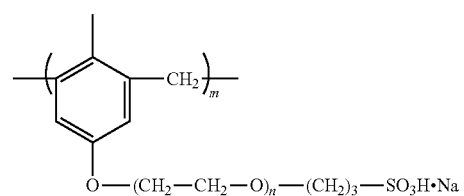

P-4
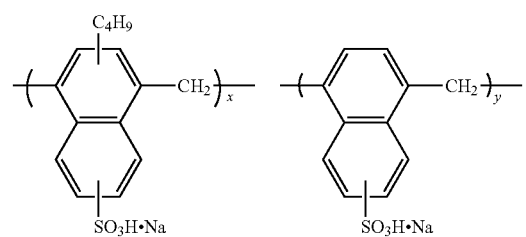

P-5
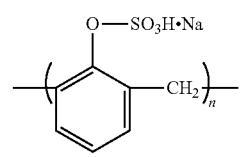

P-6
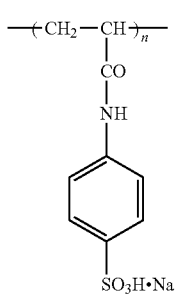
P-7
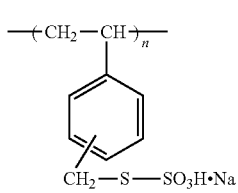
P-8
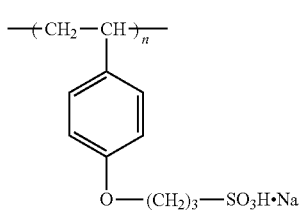
P-9
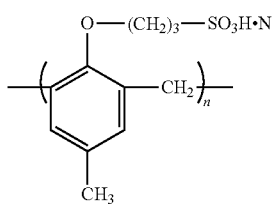
P-10
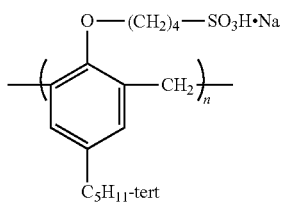
P-11
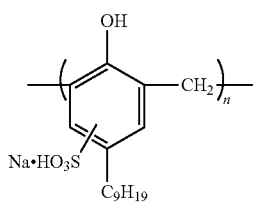
P-12
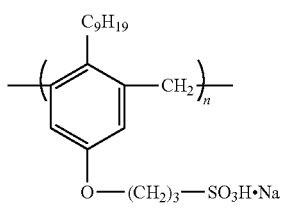
P-13
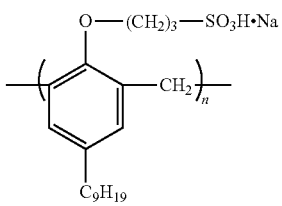
P-14
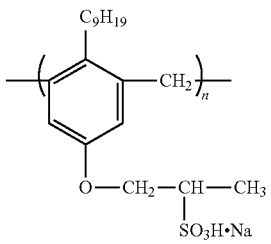
P-15
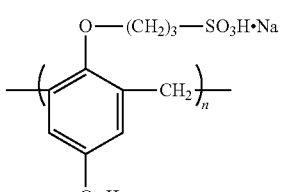
P-16
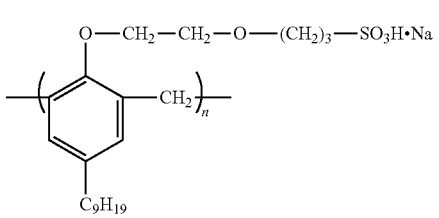
P-17
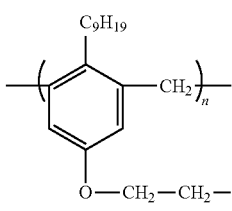
P-18
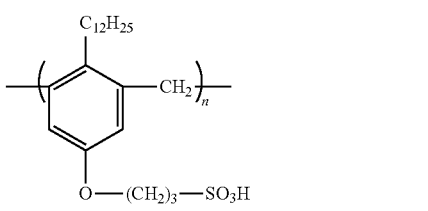
P-19
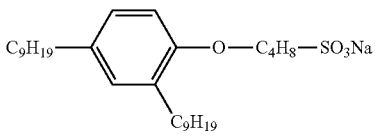

-continued

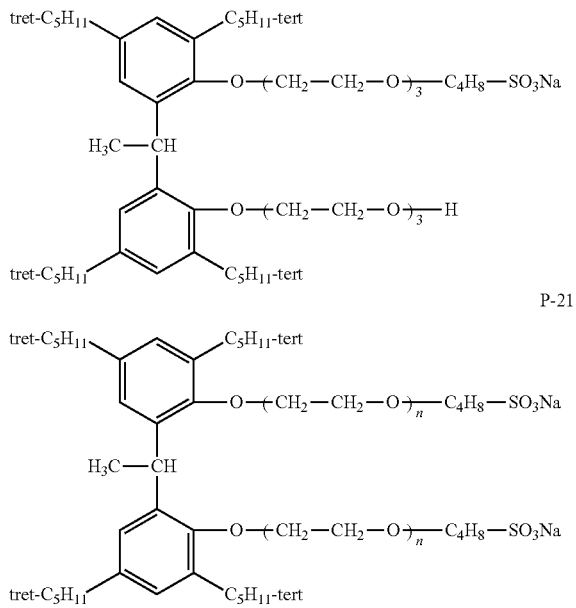

An addition amount of the (C) polymer compound having a sulfo group at a terminal is, as a total amount, with respect to 1 L of the polishing liquid when used in polishing, preferably in the range of 0.001 to 10 g, more preferably in the range of 0.01 to 5 g and particularly preferably in the range of 0.01 to 1 g. That is, the (C) polymer compound having a sulfo group at a terminal is, in 1 L of the polishing liquid, from the viewpoint of the SiOC polishing performance, preferably 0.0001 g or more, and, from the viewpoint of the foaming property, preferably 1 g or less.

(D) Inorganic Particles

The polishing liquid of the invention includes inorganic particles.

The inorganic particles used in the polishing liquid of the invention are used as polishing particles (solid abrasive grains). Examples thereof include silica (precipitated silica, fumed silica, colloidal silica, synthetic silica), alumna, ceria, zirconia, titania, germania, manganese oxide and silicon carbide, and among these, silica, alumina, ceria, zirconia and titania are preferred. In particular, silica is preferred and colloidal silica is more preferred.

The colloidal silica is preferably one obtained by hydrolysis of alkoxysilane that does not contain an impurity such as alkali metal inside of a particle. On the other hand, although colloidal silica produced by a method where alkali is removed from an aqueous solution of alkali silicate as well may be used, in this case, there may be a concern that alkali metal remaining inside of the particle may be gradually eluted to adversely affect the polishing capability. From such the viewpoint, one obtained by hydrolyzing alkoxysilane is more preferable as a raw material.

A particle size of the inorganic particle is preferably 5 nm to 200 nm, more preferably 10 nm to 100 nm and particularly preferably 20 nm to 70 nm.

A content (concentration) of the (D) inorganic particle in the polishing liquid of the invention is, with respect to an amount of the polishing liquid when used in polishing, preferably 0.5% by mass to 15% by mass, more preferably 3% by mass to 12% by mass and particularly preferably 5% by mass to 12% by mass. That is, the content of the (D) inorganic particle is, from the viewpoint of polishing a barrier layer at a sufficient polishing rate, preferably 0.5% by mass or more and, from the viewpoint of storage stability, preferably 15% by mass or less.

In the polishing liquid of the invention, as the (D) inorganic particles, colloidal silica and other inorganic particles may be used together. In that case, a content ratio of the colloidal silica with respect to the total amount of the inorganic particles is preferably 50% by mass or more and particularly preferably 80% by mass or more. All of contained abrasive grains may be colloidal silica. Examples of abrasive grains that are used together with colloidal silica in the polishing liquid in the invention include fumed silica, ceria, alumina and titania. The size of the abrasive grains that are used together is preferably the same as or more that of the colloidal silica and two times or less that of the colloidal silica.

(E) Organic Acid

The polishing liquid of the invention contains an organic acid.

Examples of the organic acids include formic acid, acetic acid, propionic acid, butylic acid, valeic acid, 2-methyl butyric acid, n-hexanoic acid, 3,3-dimetyl butyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, salts there of such as ammonium salts thereof, and alkali metal salts thereof, and mixtures thereof. Among these, compounds having a carboxyl group are preferred.

Although the compound having a carboxyl group is not particularly limited in any way, as long as the compound has at least one carboxyl group in the molecule, the compound represented by the following formula (3) is preferably selected from the perspective of the polishing rate mechanism.

Moreover, there are preferably 1 to 4 carboxyl groups in the molecule, and more preferably 1 or 2 carboxyl groups in the molecule, from the perspective of cost efficiency.

$$R^7—O—R^8—COOH \qquad \text{Formula (3)}$$

In formula (3), $R^7$ and $R^8$ each individually represent a hydrocarbon group, preferably a hydrocarbon group having 1 to 10 carbon atoms.

$R^7$ is a monovalent hydrocarbon group, and preferably an alkyl group having 1 to 10 carbon atoms such as a methyl group, a cycloalkyl group and the like, an aryl group such as a phenyl group and the like, an alkoxy group, and an aryloxy group. $R^8$ is a bivalent hydrocarbon group, and preferably an alkylene group having 1 to 10 carbon atoms such as a methylene group, a cycloalkylene group and the like, an arylene group such as a phenylene group and the like, and an alkyleneoxy group.

The hydrocarbon group represented by $R^7$ and $R^8$ may also have a substituent group. Examples of the substituent group which can be incorporated may include an alkyl group having 1 to 3 carbon atoms, an aryl group, an alkoxy group, a carboxyl group, and the like. In cases where the substituent group is a carboxyl group, the compound has plural carboxyl groups.

Moreover, $R^7$ and $R^8$ may be bound to each other to form a cyclic structure.

Examples of the compound represented by the abovementioned formula (3) may include, for example, 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, and phenoxyacetic acid. Out of these, 2,5-furandicarboxylic acid, 2-tetrahydrofurancarboxylic acid, diglycolic acid, and methoxyacetic acid are preferred from the perspective of polishing the surface to be polished at a high polishing rate.

The addition amount of (E) organic acid (preferably, a compound having a carboxyl group: a compound represented by formula (3)) with respect to the amount of the polishing liquid when used in polishing is preferably 0.1 mass % to 5 mass %, and more preferably 0.5 mass % to 2 mass %. Specifically, the amount of the compound having a carboxyl group (organic acid) is preferably 0.1 mass % or more from the perspective of achieving a sufficient polishing rate, and is preferably 5 mass % or less from the perspective of preventing excessive dishing.

Other Components:

In the polishing liquid of the invention, in addition to the components (A) to (E) that are indispensable components, other known components may be used together as long as the advantages of the invention are not affected.

Surfactant:

The polishing liquid of the invention may include a surfactant other than a nonionic surfactant. Examples of the surfactants that may be used include an anionic surfactant and a cationic surfactant.

Specific examples of the anionic surfactants include compounds such as decyl benzene sulfonic acid, dodecyl benzene sulfonic acid, tetradecyl benzene sulfonic acid, hexadecyl benzene sulfonic acid, dodecyl naphthalene sulfonic acid and tetradecyl naphthalene sulfonic acid.

Specific examples of the cationic surfactants include compounds such as lauryl trimethyl ammonium, lauryl triethyl ammonium, stearyl trimethyl ammonium, palmityl trimethyl ammonium, octyl trimethyl ammonium, dodecyl pyridium, decyl pyridium and octyl pyridium.

Examples of the anionic surfactants that may be used in the invention include, other than the sulfonates as described above, carboxylates, sulfuric acid ester salts and phosphoric acid ester salts.

Specific example thereof include carboxylic acid salts such as soap, N-acyl amino-acid salts, polyoxyethylene alkyl ether carboxylic acid salts, polyoxypropylene alkyl ether carboxylic acid salts and acylated peptides, sulfuric acid ester salts such as sulfate oils, alkyl sulfates, alkyl ether sulfates, polyoxyethylene alkyl allyl ether sulfates, polyoxypropylene alkyl allyl ether sulfates and alkylamide sulfates, phosphoric acid ester salts such as alkyl phosphates, polyoxyethylene alkl allyl ether phosphates, polyoxypropylene alkl allyl ether phosphates.

An addition amount of the surfactant other than a nonionic surfactant is, as a total amount, in 1 L of the polishing liquid when used in polishing, preferably in the range of 0.001 to 10 g, more preferably in the range of 0.01 to 5 g and particularly preferably in the range of 0.01 to 1 g. That is, an addition amount of the surfactant is, in order to obtain a sufficient advantage, preferably 0.01 g or more and, from the viewpoint of inhibiting the CMP rate from lowering, preferably 1 g or less.

Oxidizing Agent:

The polishing liquid of the present invention may include a compound capable of oxidizing the metal to be polished (oxidizing agent).

Examples of the oxidizing agent may include, for example, hydrogen peroxide, a peroxide, a nitrate, an iodate, a periodate, a hypochlorite, a chlorite, a chlorate, perchlorate, a persulfate, a dichromate, a permanganate, ozonated water, or silver (II) salt and iron (III) salt. Out of these, hydrogen peroxide is preferably employed.

As the iron (III) salt, an inorganic salt of iron (III) such as iron (III) nitrate, iron (III) chloride, iron (III) sulfate, and iron (III) bromide, and an organic complex salt of iron (III), may preferably be employed.

The amount of the oxidizing agent to be added can be regulated according to the amount of dishing at an early stage of barrier CMP. When the amount of dishing at an early stage of barrier CMP is large, i.e., the desired polishing amount of the wiring material in barrier CMP is not large, the addition amount of the oxidizing agent is preferably small. On the other hand, when the amount of dishing is substantially small and high-rate polishing of the wiring material is desired, the addition amount of the oxidizing agent is preferably large. As mentioned above, the amount of the oxidizing agent being added is preferably modified according to the dishing conditions at an early stage of barrier CMP, and is preferably 0.01 mol to 1 mol, and more preferably 0.05 mol to 0.4 mol, with respect to 1 liter of polishing solution when used in polishing.

pH Adjustor:

The polishing liquid of the present invention should have a pH in the range of 2.5 to 5.0, and more preferably a pH in the range of 3.0 to 4.5. By regulating the pH of the polishing liquid within this range, the polishing rate of the interlayer insulating film can be regulated more notably.

In order to regulate the pH within the abovementioned desired range, an alkali/acid or a buffering agent can be employed. The polishing liquid of the present invention achieves a superior effect when the pH is within the abovementioned range.

Examples of the alkali/acid or the buffering agent may preferably include ammonia; an organic ammonium hydroxide, such as ammonium hydroxide and tetramethyl ammonium hydroxide; a non-metallic alkali agent such as alkanol amines like, diethanol amine, triethanol amine, and triisopropanol amine; an alkali metal hydroxide such as, sodium hydroxide, potassium hydroxide, and lithium hydroxide; an inorganic acid, such as nitric acid, sulfuric acid, and phosphoric acid; a carbonate, such as sodium carbonate; a phosphate, such as trisodium phosphate; a borate; a tetraborate; a hydroxybenzoate; and the like. Among these, ammonium hydroxide, potassium hydroxide, lithium hydroxide, and tetramethyl ammonium hydroxide are particularly preferable.

The addition amount of the alkali/acid or the buffering agent may be determined to any amount that maintains the pH within the desired range, and is preferably 0.0001 mol to 1.0 mol, and more preferably 0.003 mol to 0.5 mol, with respect to 1 liter of the polishing liquid when used in polishing.

Chelating Agent:

The polishing liquid of the present invention may preferably include a chelating agent (i.e., a water softener), when necessary, in order to reduce adverse effects of a polyvalent metal ion incorporated therein, and the like.

Examples of the chelating agent may include a general-purpose water softener, or an analogous compound thereof, which is a calcium or magnesium precipitation inhibiting agent, for example, nitrilotriacetic acid; diethylene triamine penta-acetic acid; ethylene diamine tetra-acetic acid; N,N,N-trimethylene phosphonic acid; ethylene diamine-N,N,N',N'-tetramethylene sulfonic acid; trans-cyclohexanediamine tetraacetic acid; 1,2-diaminopropane tetraacetic acid; glycol ether diamine tetraacetic acid; ethylenediamine ortho hydroxylphenylacetic acid; ethylene diamine succinic acid (SS); N-(2-carboxylate ethyl)-L-asparagine acid; β-alanine diacetic acid; 2-phosphonobutane-1,2,4-tricarboxylic acid; 1-hydroxyethylidene-1,1-diphosphonic acid; N,N'-bis(2-hydroxybenzyl)ethylenediamine-N,N'-diacetic acid; and 1,2-dihydroxybenezene-4,6-disulfonic acid, and the like.

As necessary, two or more kinds of chelating agents may be used in combination.

The amount of the chelating agent being added can be determined at any amount as long as it is sufficient to trap metal ions, such as polyvalent metal ions, and may be, for example, 0.0003 mol to 0.07 mol per 1 liter of the polishing liquid when used in polishing.

The polishing liquid of the present invention, typically, is suitable for polishing of a barrier layer composed of a barrier metal material for preventing copper diffusion, the barrier layer being placed between wiring lines composed of a copper metal and/or a copper alloy, and an interlayer insulation film.

Barrier Metal Material:

Typically, a low resistance metal material is preferable as the material constituting the barrier layer, which is the polishing object for the polishing liquid of the present invention, and preferable examples thereof include Ta, Tan, Ti, TiN, Ru, CuMn, $MnO_2$, WN, W and Co. Out of these, Ta and TaN are especially preferable.

Interlayer Insulating Film:

As an interlayer insulating film (insulating layer) that is the polishing object for the polishing liquid of the invention, other than interlayer insulating films such as TEOS that is usually used, an interlayer insulating film including a low dielectric constant material, for instance, having the dielectric constant of about 3.5 to 2.0 (such as organic polymer based, SiOC based and SiOF based films that are ordinarily called as Low-k film) are cited.

Specifically, examples of materials that are used to form an interlayer insulating film having low dielectric constant include, in the SiOC based one, HSG-R7 (trade name, produced by Hitachi Chemical Co., Ltd.) and BLACKDIAMOND (trade name, produced by Applied Materials, Inc).

Such the Low-k film is usually positioned below a TEOS insulating film and on the TEOS insulating film a barrier layer and a metal wiring are formed.

The polishing liquid of the invention is able to suitably polish the barrier layer, when it is applied to a substrate that has a laminate structure of a Low-k film and a TEOS insulating film, is able to polish the TEOS insulating film at a high-speed, and, at a time point when the Low-k film is exposed, is able to suppress the polishing rate, thereby, the polishing that is excellent in the surface smoothness and inhibits the scratches from occurring is achieved.

Material for Wiring Lines:

The surface to be polished in the present invention preferably has wiring lines containing copper metal and/or a copper alloy, such as one applied to semi-conductor devices such as LSI chips. In particular, copper alloys are preferable as the raw material for such wiring lines. Moreover, among these, a copper alloy which includes silver is preferable.

Furthermore, the amount of silver included in the copper alloy is preferably no more than 40 mass %, more preferably no more than 10 mass %, even more preferably no more than 1 mass %, and the most superior effects can be achieved at an amount in the range of 0.00001 to 0.1 mass %.

Thickness of Wiring Lines:

When the object for polishing in the present invention is applied to DRAM type devices, the wiring lines preferably have a thickness of, in half-pitch, no more than 0.15 µm, more preferably no more than 0.10 µm, and even more preferably no more than 0.08 µm.

On the other hand, when the object for polishing is applied to MPU type devices, the wiring lines preferably have a thickness of no more than 0.12 µm, more preferably no more than 0.09 µm, and even more preferably no more than 0.07 µm.

The abovementioned polishing liquid of the present invention exhibits particularly superior effects to a surface having this type of wiring lines.

Polishing Method:

The Polishing Liquid of the Present Invention may be:

(1) in the form of a concentrated solution, which is diluted by adding water or an aqueous solution when employed;

(2) prepared by mixing aqueous solutions respectively containing the components of the polishing liquid, as mentioned below, and diluting by adding water when necessary; or (3) in the form of a liquid that can be used as is.

Any of the abovementioned polishing liquids (1) to (3) may be applied to the polishing method employing the polishing liquid of the present invention.

This polishing method is a method in which a polishing liquid is supplied onto a polishing pad placed on a polishing platen, the polishing pad is brought into contact with a surface to be polished, and the surface to be polished and polishing pad are set into relative motion.

A conventional polishing device having a holder for holding an object having a surface to be polished (for example, a wafer in which a film of conductive material is formed) and a polishing platen onto which a polishing pad is attached (equipped with a variable-speed motor and the like) may be used as the device employed in polishing.

As the polishing pad, conventional non-woven fabric, a polyurethane foam, a porous fluorocarbon resin, and the like, may be employed without being particularly limited. The rotation speed of the polishing platen is not particularly limited in any way, but is preferably as low as 200 rpm or less, so that the object to be polished does not deviate from the platen. Moreover, the contact pressure from the polishing pad to the object having the surface to be polished (a film to be polished) is preferably 0.68 to 34.5 kPa, and more preferably 3.40 to 20.7 kPa, in order to satisfy in-plane uniformity and pattern flatness of the substrate.

During polishing, the polishing liquid is continuously supplied onto the polishing pad by a pump and the like.

Once the substrate is completely polished, it is washed thoroughly with running water, and then dried by removing the water droplets on the polished surbstrate with a spin drier and the like.

When a concentrated liquid of the polishing liquid is diluted, as described in the abovementioned method (1), the aqueous solution indicated below can be employed for diluting the concentrated solution. The aqueous solution is water in which at least one component of an oxidizing agent, an organic acid, an additive agent, and a surfactant is preliminarily included, such that the total amount of the components in the aqueous solution and in the concentrated liquid is equal to that in the resulting polishing liquid when used in polishing (liquid for use).

Accordingly, when a process of preparing the polishing liquid by diluting a concentrated solution, components that do not readily dissolve can be added, subsequently, in the form of an aqueous solution. Consequently, a concentration liquid can be prepared to have an even higher degree of concentration.

Moreover, as the method of diluting the concentrated solution by adding water or an aqueous solution, a method may also be employed in which a pipe for supplying a concentrated polishing liquid and a pipe for supplying water or an aqueous solution are joined together in midstream, and thereby supplying a liquid for use of the polishing liquid that has been mixed and diluted onto the polishing pad. The mixing of the concentrated solution and the water or aqueous solution may be performed by a conventionally employed method, such as: a method in which liquids are collision-mixed by allowing the liquids to pass through a narrow path while applying pressure; a method in which a filler, such as glass pipes, is packed within the pipes, and branching/separation and convergence of the liquid streams are repeated; and a method in which a vane that is revolved by force is provided within the pipes.

The supplying rate of the polishing liquid is preferably 10 to 1000 ml/min, and more preferably 170 to 800 ml/min, in order to satisfy in-plane uniformity and pattern flatness of the surface to be polished.

Moreover, as the method of polishing while continuing to dilute the concentrated solution with water or an aqueous solution, there is a method in which the pipe supplying the polishing liquid and the pipe supplying water or the aqueous solution are separately provided, and predetermined amounts of the liquid and the water or aqueous solution is supplied onto the polishing pad from respective pipes, and polishing is carried out while mixing the liquid and the water or aqueous solution by means of the relative motion between the polishing pad and the surface to be polished. Furthermore, a polishing method may also be employed in which predetermined amounts of the concentrated liquid and the water or aqueous solution are mixed in a single container, and then the mixture is supplied onto the polishing pad.

Moreover, a polishing method may also be used in which the components which must be included in the polishing liquid are divided into at least two constituent components, and the constituent components are diluted, when employed, by adding water or an aqueous solution and supplied onto the polishing pad placed on the surface of the polishing platen, and then brought into contact with the surface to be polished, thereby performing polishing by relatively moving the surface to be polished and the polishing pad.

For example, the components may be divided in such a manner that an oxidizing agent is provided as the constituent component (A), while an organic acid, additive agent, surfactant and water are provided as the constituent component (B), and at the time of usage, the constituent components (A) and (B) are diluted with water or an aqueous solution.

Alternatively, the additive agents having low solubility may be separated to be included in either of the two constituent components (A) and (B), for example, in such a manner that the oxidizing agent, additive agent, and surfactant are provided as constituent component (A), while the organic acid, additive agent, surfactant, and water are provided as constituent component (B), and at the time of usage, the constituent components (A) and (B) are diluted with water or an aqueous solution.

In such cases as the abovementioned examples, three pipes are required in order to supply constituent component (A), constituent component (B), and water or an aqueous solution, respectively. The dilution and mixing may be carried out by a method in which the three pipes are joined to form a single pipe from which the polishing liquid is supplied onto the polishing pad, and mixing is performed within the pipe. In this case, it may also be possible that two of the pipes are joined first, and then the last pipe is joined, subsequently. This method is, specifically, that the constituent component containing the additive agent having low solubility and other constituent component(s) are mixed first, and after the mixture has passed through a long distance to ensure enough time for the additive agent to dissolve, water or an aqueous solution is supplied at the position where the last pipe is joined together.

Other mixing methods include a method in which three of the pipes are directly lead to the polishing pad, respectively, and mixing is carried out while the polishing pad and the surface to be polished are relatively moving; a method in which three constituent components are mixed in a single container, and the diluted polishing liquid is supplied onto the polishing pad; and the like.

In the abovementioned polishing methods, the temperature of the constituent components may be regulated such that the constituent component including an oxidizing agent has a temperature of no more than 40° C., while other constituent components are heated to a temperature ranging from room temperature to 100° C., and at the time of mixing those constituent components or adding water or an aqueous solution to dilute, the resulting solution has a temperature of no more than 40° C. This method is effective for elevating the solubility of the raw material having a low solubility in the polishing liquid, by utilizing a phenomenon that the solubility is elevated by increasing the temperature thereof.

The raw material that is dissolved by heating the other constituent components to a temperature ranging from room temperature to 100° C. precipitates in the solution as the temperature decreases. Therefore, when the other constituent component(s) are employed in a low temperature state, pre-heating of the precipitated components must be performed. The abovementioned heating can be achieved by applying a process in which the other constituent component(s) that have been heated to dissolve the raw material are delivered; or a process in which the liquid containing a precipitated material is stirred and delivered, while the pipe is heated to dissolve the material. If the heated other constituent component(s) increase the temperature of the constituent component(s) including the oxidizing agent up to 40° C. or more, the oxidizing agent may disintegrate. Therefore, the temperature of the mixture of the constituent component(s) including the oxidizing agent and the other constituent component(s) is preferably 40° C. or less.

As mentioned above, in the present invention, the components of the polishing liquid may be divided into at least two components, and supplied onto the surface to be polished. In such cases, it is preferable that the components are divided into a component containing the organic acid and a component including the oxide. Moreover, it may also be possible that the concentrated solution is provided as the polishing liquid, and the dilution water is separately supplied onto the surface to be polished.

In the present invention, in cases where a method in which the polishing liquid is divided into at least two groups of components and supplied onto the surface to be polished is applied, the supplying amount thereof refers to the sum of the amounts supplied from each pipe.

Pad:

As the polishing pad for polishing that can be employed in the polishing method of the present invention, either a non-foam structured pad or a foam structured pad may be applicable. The former employs a hard synthetic resin bulk material, such as a plastic plate, to form the pad. The latter further includes three types of the pad: an independent foam (dry foam type), a continuous foam (wet foam type), and a two-layer composite (laminated type). In particular, the two-layer foam composite is preferable. The foaming may be either uniform or non-uniform.

Furthermore, the pad may include abrasive grains which are conventionally employed in polishing (for example, those composed of ceria, silica, alumina, a resin, and the like).

Moreover, the hardness of the pad may be either hard or soft. In the laminated type, it is preferable that each respective layer have a different hardness. Non-woven fabric, artificial leather, polyamide, polyurethane, polyester, polycarbonate and the like can be exemplified as the preferable materials. Moreover, lattice grooves, holes, concentric grooves, helical grooves, and the like may be formed on the surface of the pad to be in contact with the surface to be polished.

Wafer:

The diameter of the wafer as the object for polishing in a CMP process employing the polishing liquid of the present invention is preferably no less than 200 mm, and in particular, preferably no less than 300 mm. When the diameter is no less than 300 mm, effects of the present invention can be remarkably exhibited Polishing Device:

The device employing the polishing liquid of the present invention in a polishing process is not particularly limited in any manner, and may include a Mirra Mesa CMP, a Reflexion CMP (trade name, manufactured by Applied Materials, Inc.), a FREX 200 and a FREX 300 (trade name, manufactured by Ebara Corporation), an NPS 3301 and an NPS 2301 (trade name, manufactured by Nikon Corporation), an A-FP-310A and an A-FP-210A (trade name, manufactured by Tokyo Seimitsu, Co., Ltd.), a 2300 TERES (trade name, manufactured by Lam Research, Co., Ltd.), a Momentum (trade name, manufactured by SpeedFam-IPEC, Inc.), and the like.

EXAMPLES

Hereinafter, the present invention will be explained in greater detail with reference to the following Examples. However, the present invention is not specifically limited to the Examples.

Example 1

A polishing liquid having a composition shown below was prepared and a polishing test was carried out.

| <Composition (1)> | |
|---|---|
| (A) quaternary ammonium cation: A1 | 0.2 g/L |
| (B) corrosion inhibiting agent: benzotriazole (BTA) | 0.5 g/L |
| (C) polymer compound having a sulfo group at a terminal: P-1 | 0.1 g/L |
| (D) inorganic particle: colloidal silica: C-1 (secondary particle diameter: 45 nm, trade name: PL3 SLURRY, produced by Fuso Kagaku K.K.) | 200 g/L |
| (E) organic acid: compound having a carboxyl group: B-1 (produced by Wako Pure Chemical Industries Ltd.) | 1 g/L |
| Oxidant: hydrogen peroxide | 10 mL |
| Total amount including pure water | 1000 mL |
| pH (adjusted by use of ammonia water and nitric acid) | 3.5 |

(Evaluation Method)

As a polishing apparatus, an apparatus (trade name: LGP-412) produced by Lap Master Co., Ltd. is used and, under the conditions below, while supplying a slurry, each of the wafer films shown below was polished.

Rotation number of table: 90 rpm

Rotation number of head: 85 rpm

Polishing pressure: 13.79 kPa

Polishing pad: POLYTEX PAD (trade name, produced by Rodel/Nitta K. K.)

Feed speed of polishing liquid: 200 ml/min (Evaluation of Polishing Rate: Subject to be Polished)

As an object to be polished, an 8-inch wafer obtained by forming, on a Si substrate, a SiOC film (trade name: BLACK DIAMOND, produced by Applied Materials, Inc.), a TEOS film, a Ta film and a copper film in this order is used.

(Evaluation of Scratch: Subject to be Polished)

As an object to be polished, an 8-inch wafer where a Low-k film and a TEOS film that were formed by a CVD method are patterned by a photolithography step and a reactive ion etching step to form groove(s) for wiring line having a width of 0.09 to 100 μm and a depth of 400 nm and a through hole, followed by forming a Ta film having a thickness of 20 nm by means of a sputtering method, further followed by forming a copper film having a thickness of 50 nm by means of a sputtering method, still further followed by forming a copper film having a total thickness of 1000 nm by means of a plating method was used.

<Polishing Speed>

The polishing rate was obtained by measuring a film thicknesses of the TEOS film (insulating film) and that of SiOC film (Low-k film) respectively before and after the polishing and by calculating from a formula below. Results are shown in Table 1.

Polishing rate(Å/min)=(film thickness before the polishing−film thickness after the polishing)/polishing time <Evaluation of Scratch>

As to the wafer (the object to be polished) for evaluating the scratch, after the TEOS layer was polished, followed by polishing to the SiOC film (polishing 20 nm of the SiOC film), a polished surface was washed with pure water and dried. The dried polished surface was observed by use of an optical microscope and the scratch was evaluated based on the evaluation criteria shown below. Here, criteria A and B are judged as practically acceptable levels. Obtained results are shown in Table 1.

—Evaluation Criteria—

A: Problematic scratch is not observed.

B: In the wafer surface, 1 to 2 problematic scratches are observed.

C: In the wafer surface, many problematic scratches are observed.

Examples 2 to 44 and Comparative Examples 1 to 3

Polishing tests for examples 2 to 44 and comparative examples 1 to 3 were carried out under the same polishings condition as those in Example 1, by using the polishing liquid prepared by using, in place of the composition (1) in example 1, compositions shown in Tables 1 to 5 below. Results are shown in Tables 1 to 5.

TABLE 1

| | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 1 | P-1 (0.001 g/L) | A1 (0.2 g/L) | B-1 (1 g/L) | C-1 (5% by mass) | BTA (1 g/L) | 3.0 | 56 | 81 | A |
| Example 2 | P-2 (0.05 g/L) | A2 (0.2 g/L) | B-1 (1 g/L) | C-1 (2.5% by mass) C-3 (2.5% by mass) | BTA (1 g/L), DP (0.5 g/L) | 3.2 | 72 | 107 | A |
| Example 3 | P-3 (0.1 g/L) | A3 (0.2 g/L) | B-2 (1 g/L) | C-2 (5% by mass) | DBTA (1 g/L) | 3.5 | 68 | 78 | A |
| Example 4 | P-4 (0.5 g/L) | A4 (0.2 g/L) | B-1 (1 g/L) | C-3 (5% by mass) | DCEBTA (1 g/L) DP (0.5 g/L) | 3.5 | 49 | 98 | A |
| Example 5 | P-5 (0.01 g/L) | A5 (0.2 g/L) | B-3 (1 g/L) | C-1 (2.5% by mass) C-3 (2.5% by mass) | BTA (1 g/L) DBS (0.5 g/L) | 3.5 | 50 | 70 | A |
| Example 6 | P-6 (0.05 g/L) | A6 (0.2 g/L) | B-1 (1 g/L) | C-4 (5% by mass) | HMBTA (1 g/L) | 4.0 | 59 | 83 | A |
| Example 7 | P-7 (0.1 g/L) | A7 (0.2 g/L) | B-1 (1 g/L) | C-4 (2.5% by mass) C-5 (2.5% by mass) | BTA (1 g/L) LTM (0.5 g/L) | 4.5 | 66 | 90 | A |
| Example 8 | P-8 (0.5 g/L) | A8 (0.2 g/L) | B-1 (1 g/L) | C-2 (5% by mass) | BTA (1 g/L) | 3.5 | 63 | 78 | A |
| Example 9 | P-9 (0.01 g/L) | A9 (0.2 g/L) | B-3 (1 g/L) | C-4 (5% by mass) | HEABTA (1 g/L) DP (0.5 g/L) | 5.0 | 61 | 112 | A |
| Example 10 | P-10 (0.05 g/L) | A10 (0.2 g/L) | B-3 (1 g/L) | C-2 (2.5% by mass) C-3 (2.5% by mass) | BTA (1 g/L) DBS (0.5 g/L) | 3.8 | 71 | 71 | A |

TABLE 2

| | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 11 | P-11 (0.1 g/L) | A11 (0.2 g/L) | B-4 (1 g/L) | C-2 (5% by mass) | BTA (1 g/L) DP (0.5 g/L) | 3.5 | 70 | 90 | A |
| Example 12 | P-12 (0.5 g/L) | A12 (0.2 g/L) | B-1 (1 g/L) | C-1 (5% by mass) | BTA (1 g/L) | 3.5 | 68 | 85 | A |
| Example 13 | P-14 (0.01 g/L) | A13 (0.2 g/L) | B-1 (1 g/L) | C-2 (5% by mass) | HMBTA (1 g/L) | 4.5 | 78 | 80 | A |
| Example 14 | P-15 (0.05 g/L) | A14 (0.2 g/L) | B-5 (1 g/L) | C-1 (5% by mass) | DBTA (1 g/L) DNS (0.5 g/L) | 3.5 | 55 | 75 | A |
| Example 15 | P-16 (0.1 g/L) | A15 (0.2 g/L) | B-1 (1 g/L) | C-1 (5% by mass) | DCEBTA (1 g/L) | 5.5 | 56 | 78 | A |
| Example 16 | P-17 (0.5 g/L) | A16 (0.2 g/L) | B-1 (1 g/L) | C-1 (5% by mass) | BTA (1 g/L) | 3.5 | 54 | 80 | A |
| Example 17 | P-18 (0.01 g/L) | A17 (0.2 g/L) | B-1 (1 g/L) | C-3 (5% by mass) | BTA (1 g/L) | 4.0 | 60 | 76 | A |
| Example 18 | P-19 (0.05 g/L) | A18 (0.2 g/L) | B-1 (1 g/L) | C-1 (5% by mass) | DBTA (1 g/L) | 3.5 | 64 | 72 | A |
| Example 19 | P-20 (0.1 g/L) | A19 (0.2 g/L) | B-1 (1 g/L) | C-2 (5% by mass) | DCEBTA (1 g/L) DBS (0.5 g/L) | 4.5 | 61 | 68 | A |
| Example 20 | P-21 (0.5 g/L) | A20 (0.2 g/L) | B-4 (1 g/L) | C-1 (5% by mass) | BTA (1 g/L) | 3.2 | 61 | 70 | A |

TABLE 3

| | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 21 | P-12 (0.01 g/L) | A21 (0.2 g/L) | B-1 (1 g/L) | C-1 (2.5% by mass) C-3 (2.5% by mass) | BTA (1 g/L) DP (0.5 g/L) | 3.5 | 55 | 92 | A |
| Example 22 | P-7 (0.05 g/L) | A22 (0.2 g/L) | B-2 (1 g/L) | C-1 (5% by mass) | BTA (1 g/L), LTM (0.5 g/L) | 4.0 | 56 | 95 | A |
| Example 23 | P-9 (0.1 g/L) | A23 (0.2 g/L) | B-1 (1 g/L) | C-1 (5% by mass) | BTA (1 g/L) DP (0.5 g/L) | 3.5 | 70 | 108 | A |
| Example 24 | P-3 (0.5 g/L) | A24 (0.2 g/L) | B-2 (1 g/L) | C-1 (5% by mass) | BTA (1 g/L) | 2.5 | 68 | 75 | A |
| Example 25 | P-5 (0.01 g/L) | A25 (0.2 g/L) | B-1 (1 g/L) | C-3 (5% by mass) | DCEBTA (1 g/L) | 3.5 | 78 | 82 | A |
| Example 26 | P-2 (0.05 g/L) | A26 (0.2 g/L) | B-1 (1 g/L) | C-2 (5% by mass) | BTA (1 g/L) DP (0.5 g/L) | 3.8 | 55 | 76 | A |
| Example 27 | P-11 (0.1 g/L) | A27 (0.2 g/L) | B-1 (1 g/L) | C-4 (5% by mass) | HEABTA (1 g/L) DP (0.5 g/L) | 4.5 | 49 | 97 | A |

TABLE 3-continued

|  | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 28 | P-17 (0.5 g/L) | A28 (0.2 g/L) | B-4 (1 g/L) | C-1 (5% by mass) | BTA (1 g/L) | 3.5 | 50 | 85 | A |
| Example 29 | P-10 (0.01 g/L) | A29 (0.2 g/L) | B-1 (1 g/L) | C-1 (5% by mass) | BTA (1 g/L) | 3.0 | 59 | 74 | A |
| Example 30 | P-2 (0.05 g/L) | A30 (0.2 g/L) | B-2 (1 g/L) | C-2 (5% by mass) | BTA (1 g/L) | 3.5 | 72 | 73 | A |

TABLE 4

|  | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 31 | P-1 (0.1 g/L) | A31 (0.2 g/L) | B-1 (1 g/L) | C-4 (5% by mass) | BTA (1 g/L) | 3.2 | 68 | 75 | A |
| Example 32 | P-4 (0.5 g/L) | A32 (0.2 g/L) | B-5 (1 g/L) | C-1 (2.5% by mass) C-3 (2.5% by mass) | BTA (1 g/L), DP (0.5 g/L) | 3.2 | 49 | 90 | A |
| Example 33 | P-7 (0.01 g/L) | Tetramethyl ammonium | B-1 (1 g/L) | C-1 (5% by mass) | BTA (1 g/L) DP (0.5 g/L) | 3.5 | 55 | 88 | A |
| Example 34 | P-17 (0.05 g/L) | Tetraethyl ammonium | B-2 (1 g/L) | C-1 (2.5% by mass) C-3 (2.5% by mass) | HEABTA (1 g/L) DP (0.5 g/L) | 3.5 | 49 | 85 | A |
| Example 35 | P-14 (0.1 g/L) | Tetrapropyl ammonium | B-1 (1 g/L) | C-1 (5% by mass) | BTA (1 g/L) | 4.0 | 64 | 75 | A |
| Example 36 | P-14 (0.5 g/L) | Tetrabutyl ammonium | B-2 (1 g/L) | C-1 (5% by mass) | BTA (1 g/L) | 4.5 | 61 | 88 | A |
| Example 37 | P-15 (0.01 g/L) | Tetrapentyl ammonium | B-1 (1 g/L) | C-1 (5% by mass) | BTA (1 g/L) | 3.5 | 61 | 105 | A |
| Example 38 | P-2 (0.05 g/L) | Tetrabutyl ammonium | B-1 (1 g/L) | C-1 (5% by mass) | BTA (1 g/L) | 4.5 | 55 | 99 | A |
| Example 39 | P-3 (0.1 g/L) | Tetrapentyl ammonium | B-5 (1 g/L) | C-2 (5% by mass) | BTA (1 g/L) DP (0.5 g/L) | 3.5 | 56 | 79 | A |
| Example 40 | P-8 (0.5 g/L) | A30 (0.2 g/L) | B-1 (1 g/L) | C-4 (5% by mass) | BTA (1 g/L) DP (0.5 g/L) | 3.0 | 70 | 95 | A |

TABLE 5

|  | Polimer compound (content) | Quaternary salt (content) | Organic acid (content) | Inorganic particle (content) | Other components (content) | pH | SiOC Polishing rate (nm/min) | TEOS Polishing rate (nm/min) | Scratch performance after polishing |
|---|---|---|---|---|---|---|---|---|---|
| Example 41 | P-9 (0.01 g/L) | A-31 (0.2 g/L) | B-1 (1 g/L) | C-1 (2.5% by mass) C-3 (2.5% by mass) | HEABTA (1 g/L) DP (0.5 g/L) | 3.5 | 68 | 88 | A |
| Example 42 | P-16 (0.01 g/L) | Tetramethyl ammonium | B-1 (1 g/L) | C-1 (5% by mass) | HEABTA (1 g/L), DP (0.5 g/L) | 3.5 | 69 | 86 | A |
| Example 43 | P-11 (0.01 g/L) | Tetraethyl ammonium | B-1 (1 g/L) | C-3 (5% by mass) | BTA (1 g/L) | 3.5 | 58 | 78 | A |
| Example 44 | P-11 (0.025 g/L) | Tetrapropyl ammonium | B-1 (1 g/L) | C-2 (5% by mass) | BTA (1 g/L) | 3.5 | 57 | 99 | A |
| Comparative Example 1 | — | — | — | C-1 (5% by mass) | Glycine (1.0 g/L) BTA (1.0 g/L) | 3.5 | 32 | 45 | B |
| Comparative Example 2 | — | — | — | C-2 (2.5% by mass) C-3 (2.5% by mass) | Glycine (1.0 g/L) BTA (1.0 g/L) | 8.5 | 35 | 20 | C |
| Comparative Example 3 | — | — | — | C-1 (5% by mass) | Iminodiacetate (1.0 g/L) BTA (1.0 g/L) | 5.5 | 29 | 35 | C |

The (A) quaternary ammonium cation (referred to as "quaternary salt" in the table) and a polymer compound having a sulfo group at a terminal (simply referred to as "polymer compound" in the table), which are described in the tables, indicate the exemplified compounds described in the above.

Furthermore, details of compounds abbreviated in the examples are shown below.

—Corrision Inhibiting Agent—
BTA: 1,2,3-benzotriazole
DBTA: 5,4-dimethyl-1,2,3-benzotriazole
DCEBTA: 1-(1,2-dicarboxyethyl)benzotriazole
HEABTA: 1-[N,N-bis(hydroxyethtyl)aminomethyl]benzotriazole
HMBTA: 1-(hydroxymethyl)benzotriazole —Organic Acid—

Compound names of compounds B-1 to B-5 having a carboxyl group and used as an organic acid are shown in the following table.

TABLE 6

| | Compound Structure |
|---|---|
| B-1 | Diglycolic acid |
| B-2 | 2,5-furan dicarboxylic acid |
| B-3 | 2-tetrahydrofuran carboxylic acid |
| B-4 | Methoxyacetic acid |
| B-5 | Carboxymethyl acetate |

—Inorganic Particle—

Shapes and primary average particle diameters of colloidal silicas C-1 to C-5 used as the inorganic particles are shown in the following table. The colloidal silicas all described in the following table are produced by Fuso Kagaku K. K.

TABLE 7

| | Name of Abrasive Grain [primary particle diameter/nm, shape] |
|---|---|
| C-1 | PL3 [35 nm, cocoon-shaped] |
| C-2 | PL3L [35 nm, spherical] |
| C-3 | PL3H [35 nm, aggregate] |
| C-4 | PL2 [25 nm, cocoon-shaped] |
| C-5 | PL2L [20 nm, spherical] |

According to the results shown above, it is evident that when the polishing liquids of the Examples are used, the polishing rate when polishing TEOS is higher, the polishing rate when polishing the SiOC insulating film (the Low-k film) is suppressed and the scratch prevention performance (scratch performance) is superior, as compared with those of the Comparative Examples.

Further, it is evident that in the polishing liquids of the Comparative Examples, the polishing rate when polishing TEOS, the suppression ability of the polishing rate when polishing the SiOC insulating film and the scratch prevention performance are all inferior compared to the polishing liquids of the Examples.

From the above, it is evident that the polishing liquids of the Examples have an excellent TEOS polishing rate, are effective in suppressing the polishing rate when polishing the SiOC insulating film (the Low-k film) and have excellent scratch prevention.

According to the invention, a polishing liquid that contains solid abrasive grains and that is used in chemical mechanical polishing in a leveling step when manufacturing a semiconductor integrated circuit, is provided. By using the polishing liquid, when a substrate having an insulating film in which an ordinary TEOS insulating film and a low dielectric constant Low-k film are laminated, it is possible to obtain an excellent polishing rate when polishing the TEOS insulating film and, even when an insulating film low in strength like the Low-k film is used, it is also possible to effectively suppress the polishing rate when polishing the Low-k film as well as the occurrence of scratches caused by the aggregation of the solid abrasive grains.

Hereinafter, exemplary embodiments of the invention will be described. However, the invention is not restricted thereto.

<1> A polishing liquid for polishing a barrier layer of a semiconductor integrated circuit, the polishing liquid comprising:
a quaternary ammonium cation,
a corrosion inhibiting agent,
a polymer compound having a sulfo group at a terminal,
inorganic particles and
an organic acid, wherein
the pH of the polishing liquid is in the range of 1 to 7.

<2> The polishing liquid of the <1>, wherein the quaternary ammonium cation is a cation represented by the following formula (1) or formula (2).

Formula (1)

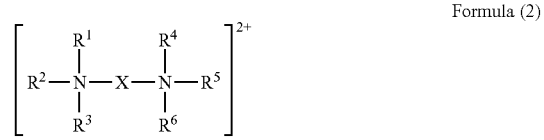

Formula (2)

In formula (1) and formula (2), $R^1$ to $R^6$ each independently represent an alkyl group having 1 to 20 carbon atoms, an alkenyl group, a cycloalkyl group, an aryl group or an aralkyl group; two of $R^1$ to $R^6$ may be bonded with each other to form a ring structure; and X represents an alkylene group having 1 to 10 carbon atoms, an alkenylene group, a cycloalkylene group, an arylene group, or a group obtained by combining at least two of these groups.

<3> The polishing liquid of <1> or <2>, wherein the polymer compound is a polymer compound containing a benzene ring.

<4> The polishing liquid of any one of <1> to <3>, wherein the inorganic particles are selected from the group consisting of silica particles, alumina particles, ceria particles, zirconia particles, titania particles and combinations of two or more thereof.

<5> The polishing liquid of any one of <1> to <4>, wherein the concentration of the inorganic particles is 0.5 to 15% by mass with respect to the total amount of the polishing liquid.

<6> The polishing liquid of any one of <1> to <5>, wherein the barrier layer to be polished comprises at least one material selected from the group consisting of Ta, TaN, Ti, TiN, Ru, CuMn, $MnO_2$, WN, W and Co.

All publications, patent applications and technical standards mentioned in this specification are herein incorporated by reference to the same extent as if each individual publication, patent application, or technical standard was specifically and individually indicated to be incorporated by reference.

What is claimed is:

1. A polishing liquid for polishing a barrier layer of a semiconductor integrated circuit, the polishing liquid comprising:
a quaternary ammonium cation;
a corrosion inhibiting agent;
a polymer compound containing a benzene ring and having a sulfo group at a terminal;
inorganic particles; and
an organic acid; wherein
the pH of the polishing liquid is in the range of 1 to 7.

2. The polishing liquid of claim 1, wherein the quaternary ammonium cation is a cation represented by the following formula (1) or formula (2):

Formula (1)

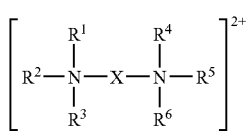

Formula (2)

wherein, in formula (1) and formula (2), $R^1$ to $R^6$ each independently represents an alkyl group having 1 to 20 carbon atoms, an alkenyl group, a cycloalkyl group, an aryl group or an aralkyl group; two of $R^1$ to $R^6$ may be bonded with each other to form a ring structure; and X represents an alkylene group having 1 to 10 carbon atoms, an alkenylene group, a cycloalkylene group, an arylene group or a group obtained by combining at least two of these groups.

3. The polishing liquid of claim 1, wherein the inorganic particles are selected from the group consisting of silica particles, alumina particles, ceria particles, zirconia particles, titania particles and combinations of two or more thereof.

4. The polishing liquid of claim 1, wherein the concentration of the inorganic particles is 0.5 to 15% by mass with respect to the total amount of the polishing liquid.

5. The polishing liquid of claim 1, wherein the barrier layer to be polished comprises at least one material selected from the group consisting of Ta, TaN, Ti, TiN, Ru, CuMn, $MnO_2$, WN, W and Co.

6. The polishing liquid of claim 1, wherein the polymer compound has a weight average molecular weight of from 500 to 5,000.

7. The polishing liquid of claim 1, wherein the quaternary ammonium cation is a cation represented by the following formula (2):

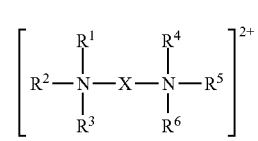

Formula (2)

wherein, in formula (2), $R^1$ to $R^6$ each independently represents an alkyl group having 1 to 20 carbon atoms, an alkenyl group, a cycloalkyl group, an aryl group or an aralkyl group; two of $R^1$ to $R^6$ may be bonded with each other to form a ring structure; and X represents an alkylene group having 1 to 10 carbon atoms, an alkenylene group, cycloalkylene group, an arylene group or a group obtained by combining at least two of these groups.

8. The polishing liquid of claim 1, wherein the organic acid comprises a compound represented by the following formula (3):

$$R^7\text{—O—}R^8\text{—COOH} \quad \text{Formula (3)}$$

wherein, in formula (3), $R^7$ and $R^8$ each individually represents a hydrocarbon group having 1 to 10 carbon atoms.

9. The polishing liquid of claim 1, wherein the polymer compound having a sulfo group at a terminal is a polymer compound having a sulfonic acid structure at a terminal.

10. The polishing liquid of claim 1, wherein the inorganic particles are colloidal silica.

\* \* \* \* \*